United States Patent [19]
Wolkstein

[11] Patent Number: 5,222,246
[45] Date of Patent: Jun. 22, 1993

[54] PARALLEL AMPLIFIERS WITH COMBINING PHASE CONTROLLED FROM COMBINER DIFFERENCE PORT

[75] Inventor: Herbert J. Wolkstein, Livingston, N.J.

[73] Assignee: General Electric Company, East Windsor, N.J.

[21] Appl. No.: 608,460

[22] Filed: Nov. 2, 1990

[51] Int. Cl.⁵ .......................................... H04B 7/185
[52] U.S. Cl. .................................. 455/13.4; 455/12.1; 455/69; 455/126; 455/304; 330/107; 333/17.1; 333/109
[58] Field of Search ................. 455/12.1, 13.4, 69, 455/89, 116, 127, 126, 304, 305, 265; 330/295, 286, 107; 333/117, 156, 136, 17.1, 109, 116

[56] References Cited

U.S. PATENT DOCUMENTS

| | | |
|---|---|---|
| 4,232,266 | 11/1980 | Acampora . |
| 4,360,813 | 11/1982 | Fitzsimmons . |
| 4,373,207 | 2/1983 | Hecken . |
| 4,383,189 | 5/1983 | D'Oro .................... 307/529 |
| 4,490,684 | 12/1984 | Epsom ..................... 330/149 |
| 4,549,152 | 10/1985 | Kumar . |
| 4,614,915 | 9/1986 | Heston et al. . |
| 4,634,992 | 1/1987 | Brown . |
| 4,656,434 | 4/1987 | Selin ........................ 330/87 |
| 4,701,716 | 10/1987 | Poole . |
| 4,723,307 | 2/1988 | Clark et al. . |
| 4,752,967 | 6/1988 | Bustamante et al. . |
| 4,868,795 | 9/1989 | McDavid et al. .......... 367/77 |
| 4,882,547 | 11/1989 | Katz . |
| 4,926,136 | 5/1990 | Olver . |
| 5,019,793 | 5/1991 | McNab .................... 333/156 |

FOREIGN PATENT DOCUMENTS

| | | |
|---|---|---|
| 3222686 | 6/1981 | Fed. Rep. of Germany . |
| 62-77028 | 4/1987 | Japan . |
| 2190261 | 11/1987 | United Kingdom . |
| 2196195 | 4/1988 | United Kingdom . |

OTHER PUBLICATIONS

"An Automatic Phase Alignment System for Transmitters", Hom et al, IEEE 1990 International Radar Conference May 7-10, 1990.

Patent Abstracts of Japan, vol. 13, No. 23 (E-705) Jan. 1989.

"Electronic Warfare Antenna systems-Past & Present", Dan Yaw, Microwave Journal, vol. 24, No. 9, Sep. 1981.

Primary Examiner—Reinhard J. Eisenzopf
Assistant Examiner—Philip J. Sobutka
Attorney, Agent, or Firm—William H. Meise; Stephen A. Young; Clement A. Berard

[57] ABSTRACT

A power amplifier arrangement includes a power divider for dividing the signal to be amplified into equal-amplitude components. Each component is amplified by a signal amplifying path. The amplified signals are applied to a phase-sensitive power combiner. The combined signal appears at the sum port and a phase-related difference signal appears at a difference port of the combiner. The difference signal is processed to produce a control signal for controlling the relative phases of the signals passing through the signal amplifying paths.

11 Claims, 5 Drawing Sheets

PARALLEL AMPLIFIERS WITH COMBINING PHASE CONTROLLED FROM COMBINER DIFFERENCE PORT

BACKGROUND OF THE INVENTION

This invention relates to arrangements for paralleling amplifiers for increased output power, and more particularly to arrangements which combine power in a hybrid power combiner including sum and difference ports, and which control the phase of the signals being combined in response to the power level at the difference port.

The paralleling of radio-frequency or microwave amplifiers and/or signal sources for higher combined power is well known. Radio frequency (RF) signals includes microwave, millimeter wave and other signals. U.S. Pat. No. 4,701,716, issued Oct. 20, 1987 in the name of Poole describes an arrangement for paralleling traveling-wave tube (TWT) amplifiers. As described therein, the signal to be amplified is applied to a 3 dB, 90° hybrid for splitting the signal into two nominally equal-amplitude portions. A similar 3 dB hybrid combiner includes a pair of input ports and a combined output port. A pair of amplifying paths extend from the output ports of the signal splitter to corresponding input ports of the power combiner. As described in the Poole patent, the phase and path length through the amplifier paths are equalized to maximize the combined power over a broad bandwidth. The difference ports of the hybrid splitters and combiner are terminated in resistors.

Paralleled amplifier arrangements may be used for transmitting radio frequency or microwave signals in repeaters and communication systems located in remote or inaccessible locations, as for example, mountain tops. The sensitivity of the phase characteristics of TWT amplifiers to power supply voltage fluctuations and to aging is notorious in the art. Solid-state amplifiers are generally not as sensitive, but may be subject to sudden changes in phase or amplitude response as a result of transient electromagnetic interference (EMI) conditions, the effects of nuclear radiation, or as a result of age-related effects due to diffusion of semiconductor dopants at high temperatures. A change in phase of less than about 10 or 15 degrees results in a reduction of combined output power of less than about 0.1 dB. Such reductions in power are ordinarily considered to be acceptable. Relative phase changes exceeding 10 or 15 degrees may result in power reduction substantially greater than 0.1 dB, or even may result in cancellation of the signal. Such changes are often considered to be unacceptable. The use of manually adjustable phase shifters in the amplifier paths is known for correcting the phase so as to achieve the desired output. When the paralleled amplifier is located in a remote or relatively inaccessible location, phase correction may require the dispatching of a maintenance technician to the location in order to correct the problem. During the interval between the occurrence of the anomaly and the arrival of the technician, the equipment may be inoperative. This may be undesirable. In some locations, as for example in submarine cables, it may not be possible to make a manual adjustment at all.

For airborne and other systems, it is important to minimize the size, weight and complexity of the equipment, including the paralleled amplifier. An improved phase correction arrangement is desired for paralleled amplifiers.

SUMMARY OF THE INVENTION

A paralleled amplifier arrangement includes a signal splitter with an input port adapted to be coupled to a source of signal to be amplified. The signal splitter also includes first and second output ports at which nominally equal-amplitude split signals are generated in response to the signal to be amplified. A hybrid power combiner includes first and second input ports and a sum output port adapted to be coupled to a utilization apparatus. The hybrid power combiner also includes a difference port. The hybrid power combiner is adapted for summing together the in-phase components of signals applied to its input ports (for a 90° hybrid power combiner, the quadrature-phase components) for generating a combined signal at the sum output port. The hybrid power combiner couples to the difference port the difference signal which represents the out-of-phase or quadrature components (for a 90° hybrid power combiner, the in-phase components) of the signals applied to its input ports. The parallel amplifier arrangement also includes first and second amplifying paths, each extending between an output port of the splitter and an input port of the combiner. A controllable phase shifting arrangement is coupled in at least one of the first and second amplifying paths. The controllable phase shifter includes a control input port, and phase shifts signals in at least one of the first or second amplifying paths under the control of a control signal applied to the control input port. A control arrangement is coupled to the difference output port of the combiner for sensing the magnitude of the signal representing the out-of-phase (or in-phase) components, and for applying the control signal to the control input port of the phase shifter in a feedback manner for tending to maintain the amplified signals near an in-phase (or quadrature) condition. In a particular embodiment of the invention, the difference signal from the power combiner is modulated onto a carrier and transmitted from a satellite to a ground station. The signal is processed at the ground station and the resulting control signal is transmitted back to the satellite for control of the phase shifter.

DESCRIPTION OF THE DRAWINGS

FIGS. 2a and 2b are together referred to as FIG. 2;

DESCRIPTION OF THE INVENTION

Figure 1:
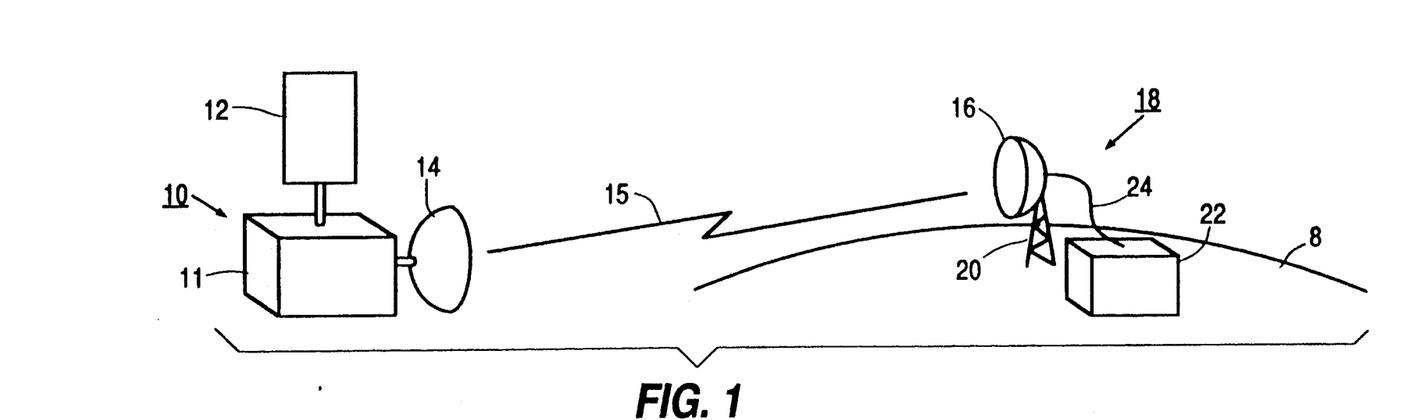
FIG. 1 is a simplified perspective or isometric view of a satellite with an antenna directed towards an Earth station for transmission of signals therebetween.

FIG. 1 is a perspective or isometric view of a satellite designated generally as 10, which includes a body 11, on which is mounted a solar panel 12 and a reflector-type antenna 14 directed toward a corresponding antenna 16 at a ground station designated generally as 18, which is situated on Earth 8. Ground station 18 includes a tower 20 for supporting antenna 16, an equipment housing 22, and transmission lines illustrated as 24 which couple antenna 16 with the equipment (not separately illustrated) located in housing 22.

Figure 2A:
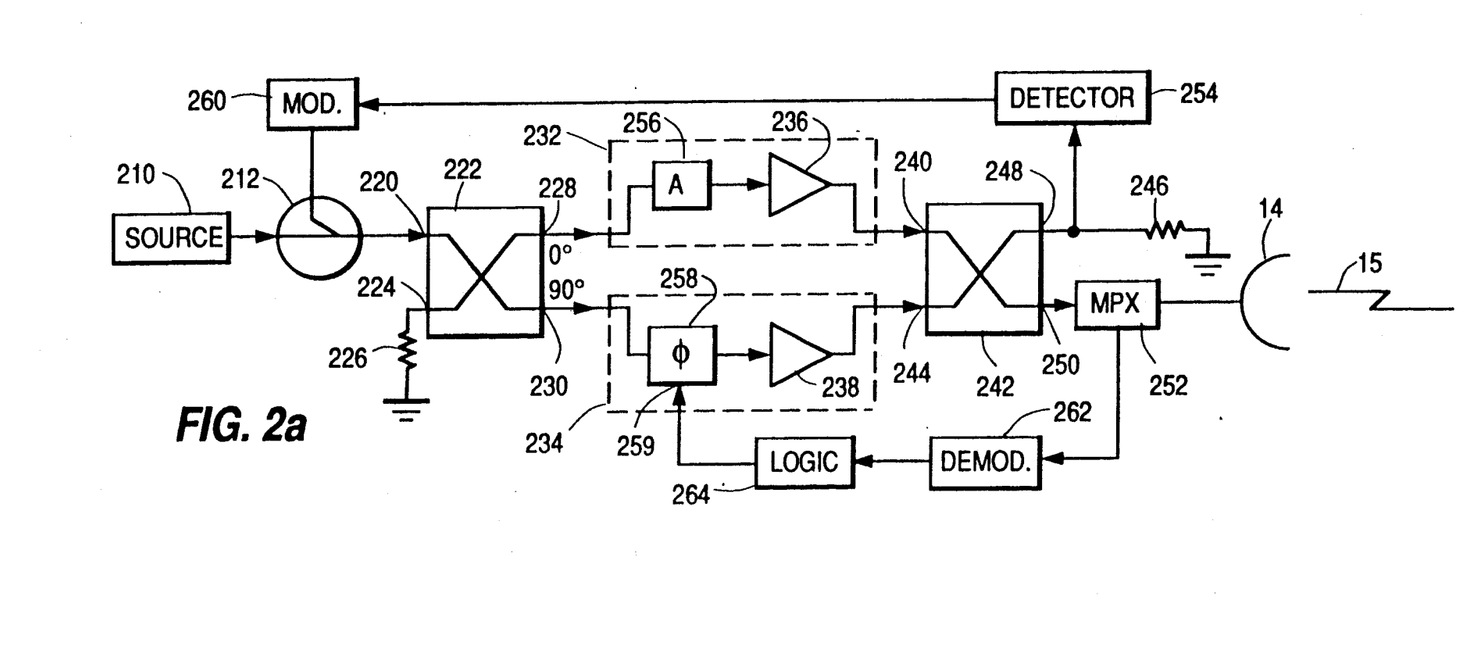
FIG. 2a is a simplified block diagram of a paralleled amplifier arrangement in accordance with an embodiment of the invention, which may be part of the satellite of FIG. 1, and which includes a hybrid power combiner and a sensor coupled to the difference output port thereof and to an uplink-downlink for transmitting signal amplitude information to the ground station of FIG. 1.

FIG. 2a is a simplified block diagram of a paralleled amplifier arrangement and ancillary circuits which may be located within satellite body 11 or in any other location remote from a control site. In FIG. 2a, source 210 may be a source of telemetry information as for example from satellite cameras, or it may be video or data originating on the Earth, which is to be retransmitted in a satellite repeater mode as described in conjunction with FIG. 6. In any case, the signals are modulated onto an RF carrier. The RF signals from source 210 are applied by way of a through path of a directional coupler 212 to a first input port 220 of a hybrid signal splitter 222. A second port 224 of hybrid splitter 222 is coupled to a matched terminating resistor 226. Nominally equal-amplitude signals are generated at output ports 228 and 230 of hybrid signal splitter 222. Those skilled in the art know that hybrid power dividers or signal splitters such as splitter 222 couple signals between ports 220 and 228 at the center frequency with a reference phase, and between input port 220 and output port 230 with a phase delay corresponding to a nominal 90° phase shift relative to the reference phase.

A similar or identical hybrid signal splitter used as a power combiner is illustrated as 242 in FIG. 2a. Hybrid power combiner 242 includes first and second input ports 240 and 244, respectively. Combiner 242 also includes a sum or combined output port 250 at which a combined signal appears when the signals applied to input ports 240 and 242 are in phase quadrature (with a 90° relative phase), and a difference output port 250 at which a signal is generated which represents the mutually in-phase components of the signals applied to input ports 240 and 244. Port 248 is coupled to a terminating resistor 246.

A first signal amplifying path, designated 232 in FIG. 2a, extends between output port 228 of signal splitter 222 and input port 240 of power combiner 242. Path 232 includes the cascade of a variable attenuator (A) 256 and an amplifier 236, for amplifying the reference-phase (0°) signals produced at the output port 228 of signal splitter 222 and for applying the amplified signals to input port 240 of power combiner 242. The phase of the signal arriving at input port 240 will be modified by the path length of path 232 and by any phase shifts introduced by attenuator 256 and amplifier 236.

A second signal amplifying path 234 extends between output port 230 of signal splitter 222 and input port 244 of power combiner 242. Path 234 includes a controllable phase-shifter 258 and an amplifier 238, for phase-shifting and amplifying the nominally quadrature-phase signals from output port 230 of signal splitter 222 and for applying the phase-shifted and amplified signals to input port 244 of power combiner 242. Phase shifter 258 includes a control input port 259.

As so far described, signals from source 210 of FIG. 2a are divided into two nominally equal-amplitude, mutually quadrature-phase signal portions, each of which is amplified by one of signal paths 232 or 234. The amplified signals are applied to power combiner 242, which produces a signal at combined output port 250 which represents the combined power of the two amplified signals applied to its inputs, so long as those signals are nominally in phase quadrature. Attenuator 250 is adjusted so that the signal amplitude or power of the signal applied from path 232 to input port 240 equals that applied from path 234 to input port 244. Phase shifter 258 is adjusted as described in more detail below so that the two amplified signals applied to input ports 240 and 244 are near phase quadrature. With this phase and amplitude condition of the signals at input ports 240 and 244 of power combiner 242, the combined signal at sum output port 250 is very near its maximum value, and the signal at difference port 248 is near a null.

The combined signal is coupled from output port 250 of power combiner 242 of FIG. 2a through a transmit-receive multiplex (MPX) arrangement to antenna 14 for transmission over path 15 to Earth station 18 (FIG. 1). Multiplex arrangement 252 may be a frequency division filtering and translation unit which transmits and receives on different frequencies, and which translates some received signals to the transmit frequency in a repeater mode of operation, all as known in the art.

In accordance with an aspect of the invention, the amplitude of the difference signal at output port 248 of power combiner 242 is monitored and used to control phase shifter 258. In accordance with another aspect of the invention, the control is accomplished via the down link and uplink communications paths. In FIG. 2a, a high-impedance detector illustrated as a block 254 detects the signal amplitude at difference output port 248 of power combiner 242 to produce a signal (possibly in digital form) representative of the amplitude of the difference signal This amplitude-representative signal is coupled to a modulator 260, which modulates the amplitude-representative signal onto a carrier at a transmitter frequency. The carrier modulated with the amplitude-representative signal is coupled through the tap of directional coupler 212 and flows to input port 220 of signal splitter 222. The modulated signal is split, amplified, combined, and transmitted from antenna 14 by way of path 15 to antenna 16 of Earth station 18 (FIG. 1).

Figure 2B:
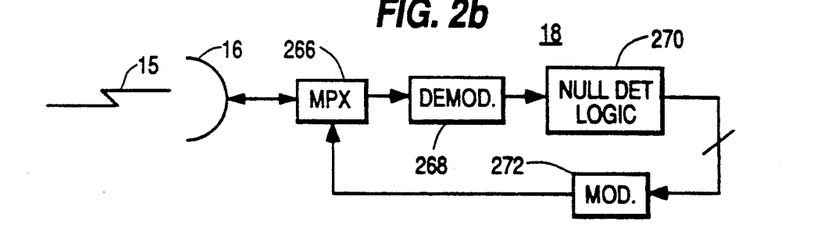
FIG. 2b is a simplified block diagram of equipment, which may be located at the ground station, for interacting with the paralleled amplifier arrangement of FIG. 2a by performing control of the phase of the hybrid input signals.

Referring now to FIG. 2b, the signals received by antenna 16 over path 15 are coupled through a transmit-receive multiplexer 266 to a demodulator 268 which demodulates the received signals, including the amplitude-representative signal originating from detector 254 of FIG. 2a. The demodulated amplitude-representative signal is applied to null detector logic illustrated as a block 270, which generates baseband command signals which ultimately result in setting phase shifter 258 (FIG. 2a) to a value providing a desired phase shift. The baseband command signals are applied to a modulator 272, which modulates the baseband command signals onto a transmit carrier, and applies the modulated command signals (together with other signals, not illustrated) to another port of multiplexer 266, whereby the modulated command signals are transmitted back through antenna 16, and over path 15 to antenna 14 of satellite 10 (FIG. 2a).

Referring once again to FIG. 2a, the modulated command signals are routed by multiplexer 252 to a demodulator 262, which demodulates the modulated command signals to baseband. The resulting baseband command signals flow to a logic circuit 264 which generates signals for command of phase shifter 258.

In accordance with an aspect of the invention, phase shifter 258 is a 4-bit step phase shifter controlling 180°, 90°, 45° and 22½°. steps of phase shift. Selection of the appropriate control signal provides increments of 22½°. Sixteen increments, each of 22½°, equals 360°, so a four-bit phase shifter can correct any phase to within a maximum phase error of ±11¼°. Stepwise controllable phase shifters are well known in the art, and are described for example in U.S. Pat. No. 4,754,265 issued Jun. 28, 1988 in the name of Henderson et al. An analog phase shifter may be used as an alternative as described below.

As described above, the amplitude error at sum output port 250 of power combiner 242 is acceptable for phase errors of less than about 10° or 15°. Thus, the ability to phase-correct to within 11¼° maximum phase error results in acceptable operation.

Figure 3:
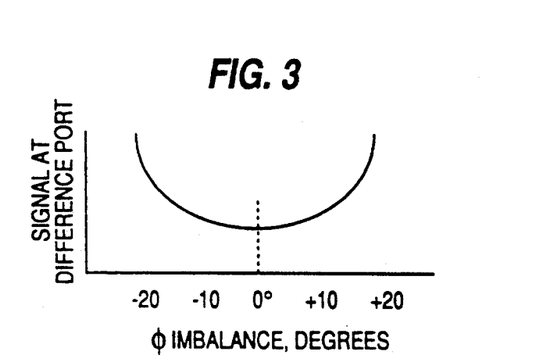
FIG. 3 is an idealized plot of signal at the difference port of a power combiner of FIGS. 2a or 3 plotted against phase imbalance.

FIG. 3 is a plot illustrating the trend of signal power at difference output port 248 as a function of phase error (in this case, deviation from phase quadrature) of the signals applied to input ports 240 and 244 of power combiner 242 of FIG. 2a. In general, the signal amplitude is at a null value, which may not be equal to zero, for phase errors in the range of about ±10°. The null may be used to indicate when phase shift is near the correct value.

Figure 4:
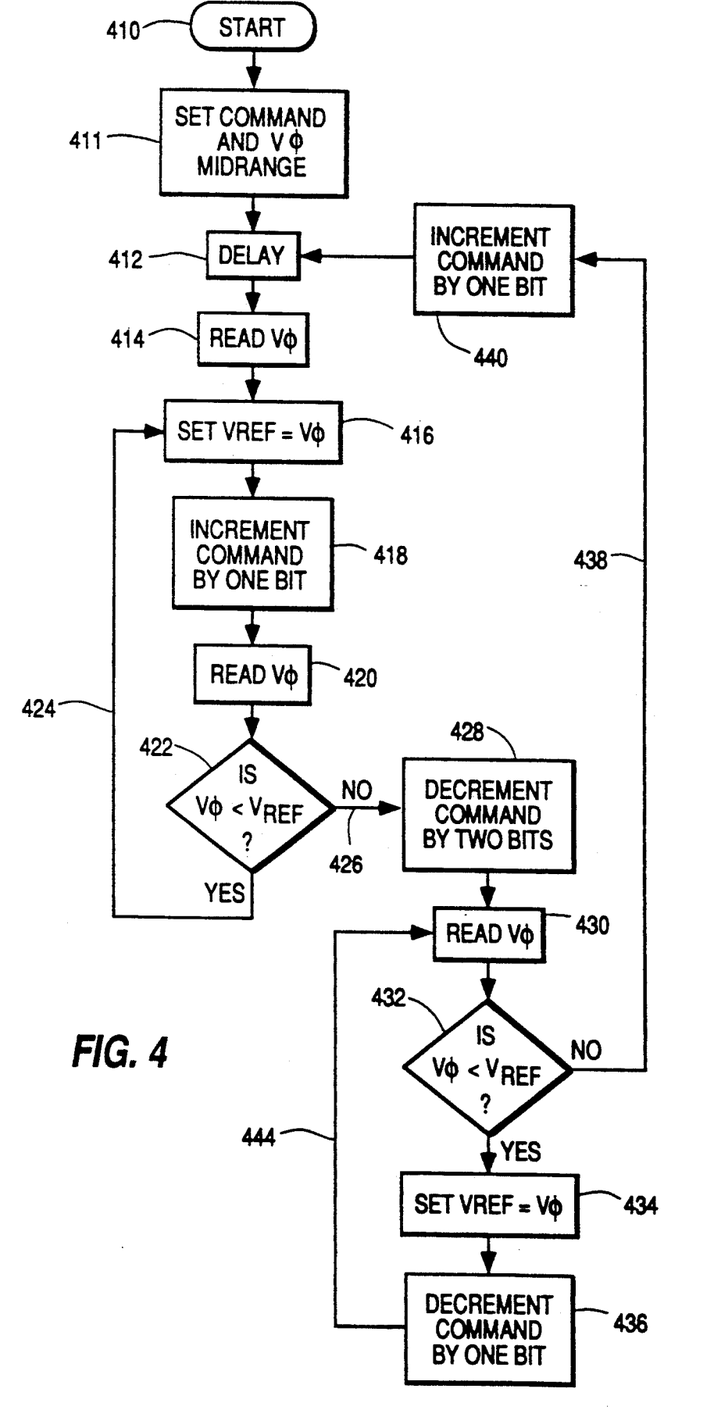
FIG. 4 is a flow chart describing logic operations for determining the phase shift corresponding to a null condition and for generating a control signal for the phase shifters of FIGS. 2, 5 or 6.

FIG. 4 is a simplified flow chart illustrating the logic flow of null detector logic 270 of FIG. 2b. In FIG. 4, the logic begins at a START block 410 and flows to a block 411, representing the initial setting of the output control (COMMAND) signal to a mid-range value, and a variable $V\phi$ is also set to a dummy initial value. From there, the logic progresses to a DELAY block 412, representing a time delay to prevent the logic loop from correcting too frequently. From block 412, the logic arrives at a block 414, representing the reading of the signal representing the magnitude of the telemetered voltage appearing at difference output port 248 of hybrid combiner 242 of FIG. 2a, as detected by detector 254, modulated by modulator 260, transmitted to the receiver of FIG. 2b, and as demodulated by demodulator 268 of FIG. 2b. The actual measured value of the difference signal is substituted for the dummy value assigned to $V\phi$, and thereafter $V\phi$ represents measured values of the difference signal. A variable VREF is set to equal the currently measured value of $V\phi$ in a block 416 to thereby create a reference value against which the result of the next change may be compared. Block 418 represents the incrementing of the COMMAND output signal by one bit. This in turn causes the phase of phase shifter 258 of FIG. 2a to change by 22½°. The new value of $V\phi$ may differ from the previous value, because of a change of the relative phases of the signals applied to input ports 240 and 244 of hybrid combiner 242. Block 420 represents a reading of the new value of $V\phi$ which results from the change in combining phase. From block 420, the logic flows to a decision block 422, in which the current value of $V\phi$ is compared with the previous value, VREF. If the incrementing of COMMAND has resulted in a decrease of $V\phi$, $V\phi$ will be less than VREF, thereby indicating that the increment moved the relative phase of the signals applied to input ports 240 and 244 of hybrid combiner 242 of FIG. 2 closer to the desired value, i.e., in the "right" direction. On the other hand, if incrementing, COMMAND has resulted in an increase in $V\phi$, this means that the phase of the signals applied to hybrid combiner 242 were changed in the "wrong" direction. If $V\phi$ is less than VREF, the logic exits decision block 422 by the YES path and flows by a logic path 424 back to block 416, where the last or current value of $V\phi$ is made the new reference value VREF. The logic flows one again through blocks 418, 420 and 422, thereby forming a logic loop which continually increments COMMAND so long as each increment results in a decrease in the difference voltage represented by $V\phi$.

Eventually, the value of $V\phi$ will not decrease when COMMAND is incremented, representing a phase condition within 10° or 15° of the 0° point in FIG. 3. The value of $V\phi$ may even increase, meaning that the logic which increments the value of COMMAND is resulting in a change of the relative phase away from the desired condition. When $V\phi$ is not less than VREF, i.e. when VREF is less than or equal to $V\phi$, the logic leaves decision block 422 by the NO output, and flows by a logic path 426 to a further block 428. In block 428, the value of COMMAND is decremented by two bits. If the decrement in block 428 were by only one bit, the phase shifter condition would correspond to that at which the current value of VREF was set, in which case if $V\phi$ were to be read it would always equal VREF (except for unavoidable errors in resetting), because it would be comparing two measurements at the same phase shifter setting. The decrement by two bits moves the phase shifter condition back, past that which it had prior to the preceding increment of COMMAND. The current value of $V\phi$ is measured in block 430, and the logic then reaches a decision block 432. The current value of $V\phi$ is compared with VREF in decision block 432. It may be expected that $V\phi$ will exceed VREF, in which case the logic leaves decision block 432 and proceeds via a logic path 438 to a block 440. The value of COMMAND is incremented by one bit in block 440, and the logic loop is closed by a return to DELAY block 412. If the value of $V\phi$ happens to be less than VREF when tested in decision block 432, the logic leaves by the YES output and flows in another logic loop, resulting in setting of VREF=$V\phi$ in a block 434, a decrement of COMMAND by one bit in a block 436, and a flow by way of a logic path 444 back to block 430, for thereby continuing the decrements of COMMAND so long as a decrement results in a reduction of $V\phi$. It may be necessary to insert delays following each logic block in FIG. 4 which implements a COMMAND value change (blocks 418, 428, 436, and 440) to allow time for the change to be transmitted to the spacecraft, for the change to be implemented, the detector to settle, and for retransmission of the new difference voltage back to the Earth station. This time lag is not a problem, because the phase errors for which the invention provides correction generally occur slowly, accumulating over time. Thus, a control loop which makes corrections slowly may be sufficient to maintain satisfactory performance.

Since the phase shifter may be completely miss-set from time to time, the combined output signal from sum port 250 of combiner 242 of FIG. 2 may be at a null, so the Earth station would receive no signal. In the absence of a signal, it might be assumed that the phase correction could not be made, because no amplitude-related signal is available upon which null detector logic can operate. If this condition should prevail, it is a simple matter to manually command a 180° phase change, then allow the automatic control to resume command.

Figure 5:
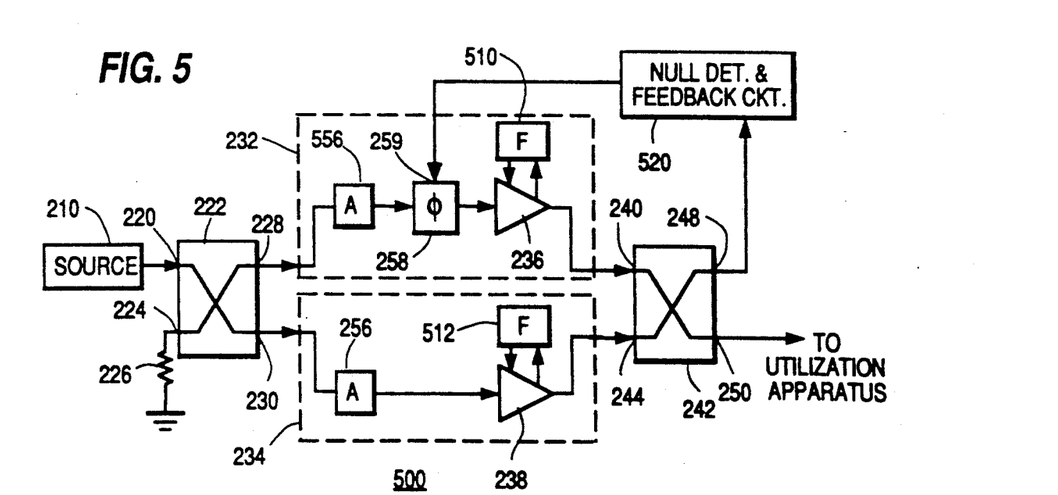
FIG. 5 is a simplified block diagram of another embodiment of the invention for autonomous control of the relative phase shift of the amplifying paths of the paralleled amplifier arrangement in the satellite of FIG. 1.

FIG. 5 is a simplified block diagram of a paralleled amplifier 500 for use at an inaccessible location, such as an satellite 10 of FIG. 1. Amplifier 500 operates autonomously, without a data link to a ground station. Elements of FIG. 5 corresponding to those of FIG. 2a are designated by like reference numerals. In FIG. 5, each amplifier 236, 238 is coupled in an autonomous amplitude control feedback (F) loop 510, 512, respectively, for maintaining constant output signal amplitude regardless of age or temperature-related changes in gain. Such loops are well known in the art. Each signal amplifying path 232 and 234 includes a controllable attenuator 256 or 526, which is initially set to make the outputs of amplifiers 236 and 238 equal with the amplitude control feedback loops disabled. Phase shifter 258 is coupled in a feedback loop for maintaining the combined output signal at sum output port 250 of power combiner 242 near maximum. For this purpose, phase shifter 258 may be a phase shifter with 22½° increments as described above, and null detector and logic circuit 520 may be similar to logic 270 of FIGS. 2b and 4. The command signal is applied directly to the phase shifter in FIG. 5 rather than by way of a transmission path.

Phase shifter 258 of FIG. 5 may be an analog phase shifter, in which case null detector and feedback current 520 may be similar to logic 270 of FIG. 2b, with the addition of a digital-to-analog converter to convert the 4-bit digital command signal to an analog control signal for application to control input port 259 of phase shifter 258.

Figure 6:
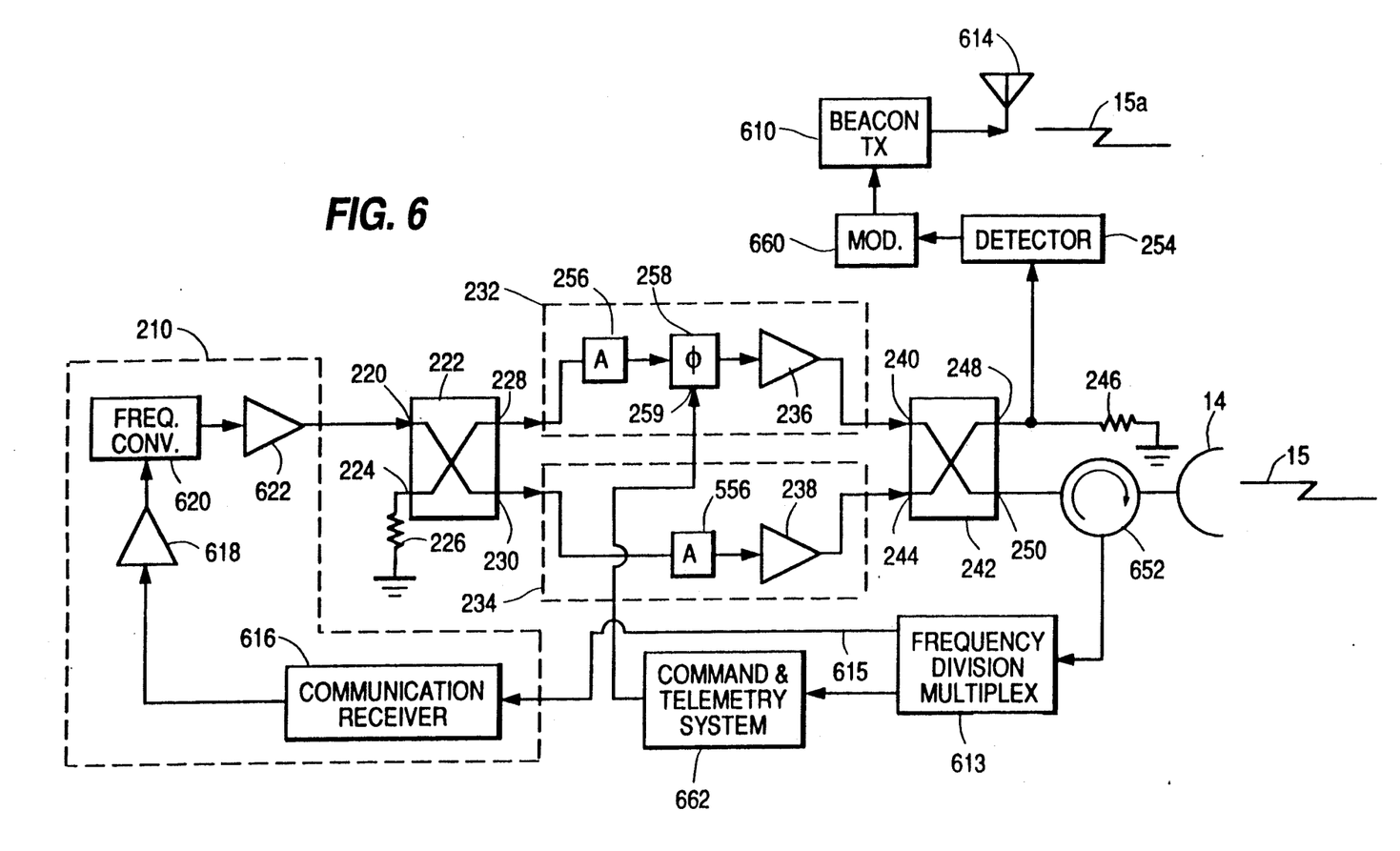
FIG. 6 is a simplified block diagram of a paralleled amplifier arrangement according to another embodiment of the invention, in which the hybrid difference port signal is transmitted to the Earth station by a separate beacon antenna, and the phase command signal is multiplexed into the uplinks of a communications repeater system.

FIG. 6 is a simplified block diagram of another embodiment of the invention for use on a spacecraft. FIG. 6 is generally similar to FIG. 2a, and corresponding elements of FIG. 6 are designated by the same reference numerals In general, the arrangement of FIG. 6 is part of a communications satellite which includes an uplink and a downlink as in FIG. 2a, and differs from that of FIG. 2a in that a separate beacon transmitter and antenna are used to transmit the difference port amplitude information to the ground station, while the command signals are returned to the spacecraft by way of the communications uplink.

In FIG. 6, uplink-downlink antenna 14 is coupled to a circulator 652, which allows amplified signal from sum output port 250 of hybrid combiner 242 to reach antenna 14 for transmission, and which couples received signals to a frequency division multiplexer 613. Multiplexer 613 couples signals at command and telemetry frequencies to a command and telemetry system 662, a portion of which demodulates phase command signals for application to control input port 259 of phase shifter 258 for control thereof as described in conjunction with FIGS. 2 and 4.

The video, audio or data (data) signals which are to be relayed by the system of FIG. 6 are coupled out of multiplexer 613 by way of a path 615 to a communications receiver 616, which may demodulate the signals to baseband for processing, and/or perform other signal processing tasks. The processed data signals are applied to a frequency converter 620 by way of an amplifier 618. Converter 620 may include an upconverter if receiver 616 converts to baseband, or converter 620 may be a simple frequency translator which converts signals received at the uplink frequency band to a different downlink frequency band.

FIG. 6 also includes a detector 254 coupled to difference output port 248 of hybrid combiner 242, for performing a function corresponding to that of detector 254 of FIG. 2a. Detector 254 couples the detected null signal to a modulator 660, which modulates the amplitude-representative signal onto a beacon frequency signal in a transmitter (TX) 610. Such beacons are commonly used on spacecraft in conjunction with an antenna such as 614 which has a relatively omnidirectional radiation pattern, so that signals can be transmitted (and/or received) between the spacecraft and the ground station regardless of the attitude of the spacecraft. At the ground station, a separate beacon receiver (not illustrated) receives the beacon signal and couples it to a null detection logic circuit such as 27 of FIG. 2b.

In operation of the arrangement of FIG. 6, the signal at difference port 248 of hybrid 242 is continuously detected in detector 254 to form an amplitude-representative signal, which is modulated (660) for transmission by beacon transmitter 610 and antenna 614 over a line-of-sight path 15a to the ground station. At the ground station, the received signal is demodulated to form baseband amplitude-representative signal. The amplitude-representative signal is periodically sampled as required by the logic of FIG. 4. The resulting command signals are modulated onto an uplink carrier frequency as in block 272 of FIG. 2a, and transmitted over transmission path 15 at an uplink frequency to antenna 14 of FIG. 6. The modulated command signals are coupled by circulator 652 to frequency division multiplexer 613, which separates the modulated command signals and applies them to command and telemetry system 662. Command & telemetry system 662 demodulates the modulated command signal to recover the baseband command signal, which is applied to control input port 259 of phase shifter 258 for control as described in conjunction with FIG. 4.

Figure 7:
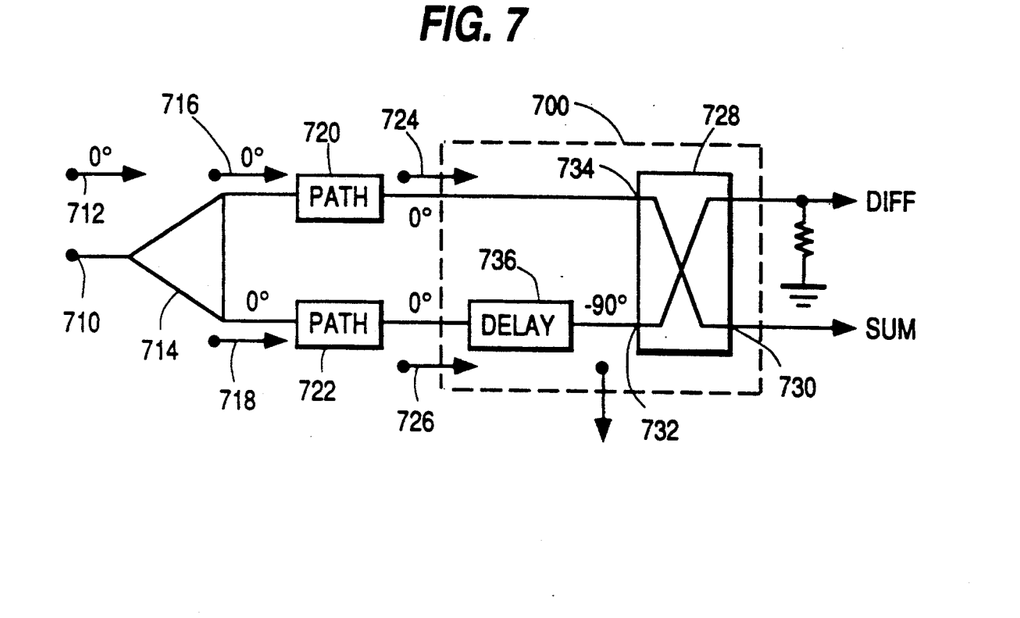
FIG. 7 is a simplified block diagram of an embodiment of the invention using a 0° signal splitter and a 0° power combiner.

FIG. 7 illustrates a system according to the invention in which a 0° phase splitter and a 0° phase combiner are used. In FIG. 7, signal to be amplified is applied by way of an input port 710 to a 0° amplitude splitter 714. A simple 0° splitter might be a resistive splitter, for example. The phase of the applied signal is 0°, represented by an arrow 712. The two equal-amplitude signals at the output of splitter 714 have 0° phase, indicated by arrows 716 and 718. Each of the split signals passes through an amplifying path 720, 722, respectively, and the resulting amplified signals have zero degrees relative phase, indicated by arrows 724 and 726. The amplified signals are applied to an in-phase power combiner designated 700, which includes a 90°, 3 dB hybrid power combiner 728 similar to combiner 242 of FIG. 2a. Combiner 728 produces a sum output at its output port 730 when the phase of the signal applied to its input port 732 lags the phase of the signal applied to input port 734 by 90°. In-phase combiner 700 further includes a delay line 736 which delays by 90° at the frequency of interest, so that 0° signal 726 at the output of path 722 is shifted by 90° relative to signal 724. Thus, the addition of a simple delay or phase shifter can turn a 90° power combiner into a 0° power combiner.

Figure 8:
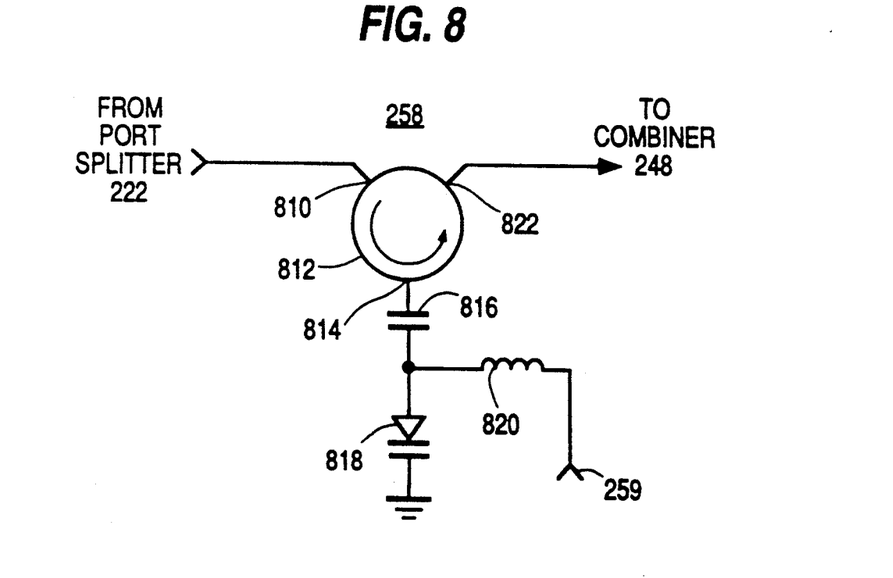
FIG. 8 is a simplified schematic diagram of an analog phase shifter which may be used in the arrangements of FIGS. 2a, 5, or 6.

FIG. 8 illustrates an analog RF phase shifter which may be used as phase shifter 258 of FIGS. 2a, 5 or 6, so long as a digital-to-analog converter is available, if required, to change a digital control signal into an analog control signal. In FIG. 8, RF to be phase shifted arrives from splitter 222 at a port 810 of a circulator 812. Circulator 812 circulates the RF signal to a port 814, where it exits and is applied through a dc blocking capacitor 816 to a variable capacitance diode 818. Diode 818 is biased by a controllable direct voltage control applied thereacross from control input port 259 by way of an RF isolation element illustrated as an inductor 820. Depending upon the operating frequency, inductor 820 may be implemented as a solenoidal coil, possibly loaded by a magnetic material, or as a section of transmission line of high impedance. Diode 818 reflects the RF signal with a phase shift controlled by the bias. The reflected RF signal re-enters port 814 of circulator 812, and is circulated to output port 822 for propagation toward combiner 248.

Other embodiments of the invention will be apparent to those skilled in the art. For example, the signal paths 232, 234 of FIGS. 2, 5 or 6, extending between the power splitter and power combiner, may include other elements such as predistortion equalizers or linearizers, amplitude correctors, pilot signal injectors or removers, and the like. Each satellite may include many paralleled amplifiers for handling plural channels. The combined output signal from one paralleled amplifier arrangement may be combined with another combined output signal to produce a still higher power output signal. If detector 254 of FIG. 2a provides an impedance match to output port 248 of power combiner 242, terminating resistor 246 may be dispensed with. While the power splitter has been described as producing nominally equal-amplitude signals, those skilled in the art know that the signals need be balanced only at the inputs of the amplifiers if the amplifiers have equal gain, and may even be unbalanced at the inputs of the amplifiers in order to compensate for unequal amplifier gains. While a four-bit control signal has been described, smaller phase increments can be obtained by using a larger number of bits. Also, manual command may be used instead of the automatic control which has been described.

What is claimed is:

1. A paralleled amplifier arrangement, comprising:
signal splitting means including an input port adapted to be coupled to a source of signal to be amplified and also including first and second output ports at which nominally equal-amplitude split signals are generated in response to said signal to be amplified;
hybrid power combining means including first and second input ports, a sum output port adapted to be coupled to utilization means, and a difference output port, for summing together the quadrature phase components of signals applied to said first and second input ports of said combining means for generating a combined signal at said sum output port for application to said utilization means, and for coupling to said difference output port a difference signal representing the in-phase components of said signals applied to said first and second input ports of said combining means;
first and second amplifying paths, said first amplifying path extending between said first output port of said splitting means and said first input port of said combining means, and said second amplifying path extending between said second output port of said splitting means and said second input port of said combining means, for amplifying said split signals to produce amplified signals, whereby said amplified signals are combined by said combining means to produce a combined amplified signal;
controllable phase shifting means coupled in at least one of said first and second amplifying paths, said controllable phase shifting means including a control input port, for phase-shifting signals in at least one of said first and second amplifying paths relative to the other under control of a control signal applied to said control input port; and
control means coupled to said difference output port of said combining means and comprising amplitude null detection means for sensing the amplitude of said difference signal to produce an amplitude-representative signal, and for, in response to said amplitude-representative signal, generating and applying to said control input port of said phase shifting means a control signal in a feedback manner for thereby tending to maintain said amplified signals near a quadrature phase condition for thereby tending to maximize said combined amplified signal.

2. An arrangement according to claim 1, wherein said control means comprises:
first modulating means coupled to said difference output port of said combining means for modulating a carrier with said amplitude representative signal to produce a first modulated carrier;
antenna means coupled to said first modulating means for radiating said first modulated carrier to produce a radiated signal directed in a path toward a remote station;
receiving and control means located at said remote station for receiving said radiated signal, and for responding to the amplitude-representative signal associated therewith for generating said control signal, and for coupling said control signal to said control input port of said phase shifting means.

3. An arrangement according to claim 2, further comprising:
second modulating means located at said remote location and coupled for receiving said control signal and for modulating said control signal onto a carrier signal at a selected frequency to produce a second modulated signal;
transmitting means coupled to said second modulating means for transmitting said second modulated signal back along said path toward said paralleled amplifier arrangement;
second receiving means coupled to said phase shifting means for receiving said second modulated signal, for demodulating said second modulated signal for recovering said control signal, and for applying said control signal to said control input port of said phase shifting means.

4. An arrangement according to claim 2, wherein said receiving and control means comprises logic means for recurrently changing said control signal near a value which causes said phase shifting means to shift phase in a manner which maintains said difference signal near its least value.

5. An arrangement according to claim 4, wherein said logic means includes a logic loop, and said logic loop includes delay means which has a delay which exceeds the round-trip time between said location of said paralleled amplifier arrangement and said remote location.

6. A method for amplifying signals to be amplified, comprising the steps of:
   splitting said signals to be amplified into first and second nominally equal-amplitude portions to thereby generate first and second split signals;
   passing said first and second split signals through first and second amplifying paths, respectively, located on a satellite orbiting a heavenly body, to thereby generate first and second amplified signals, respectively;
   applying said first and second amplified signals to first and second input ports, respectively, of a hybrid power combiner, which power combiner also includes a sum output port at which the quadrature phase components of said first and second signals are summed to produce a combined amplified signal, and which also includes a difference output port at which a difference signal component is generated representing the in-phase component;
   sensing the amplitude of said difference signal at said difference output port;
   transmitting said difference signal to said heavenly body;
   generating a phase control signal in response to said amplitude of said difference signal; and
   controlling the relative phases of said first and second amplified signals in response to said phase control signal in a manner tending to maximize said combined amplified signal.

7. A method according to claim 6 wherein said step of generating said phase control signal is performed on said heavenly body, and further comprising the step of transmitting said phase control signal to said satellite.

8. A satellite arrangement, comprising:
   a source of RF signal to be transmitted from said satellite to Earth;
   signal splitting means including an input port adapted for receiving RF signals, and also including first and second output ports at which nominally equal-amplitude signals are produced in response to signals applied to said input port of said signal splitting means;
   a first path for the flow of RF signal, said first path extending between said source of RF signal to be transmitted and said input port of said signal splitter, whereby said RF signal to be transmitted is divided into first and second nominally equal-amplitude portions;
   a hybrid signal combiner including first and second input ports, a sum output port and a difference output port;
   a second path for the flow of RF signal, said second path extending between said first output port of said signal splitting means and said first input port of said hybrid signal combiner, said second path including controllable phase shifting means cascaded with first amplifying means, for controllably phase shifting and amplifying said first portion of said RF signal;
   a third path for the flow of RF signal, said third path extending between said second output port of said signal splitting means and said second input port of said hybrid combining means, said third path including second amplifying means, for at least amplifying said second portion of said RF signal whereby a sum RF signal is generated at said sum output port of said hybrid power combiner, and a difference RF signal is generated at said difference port;
   detector means coupled to said difference port of said hybrid power combiner for detecting said difference RF signal and for generating an amplitude-representative signal representative of the amplitude of said difference signal;
   first modulating means coupled to said detector means for modulating said amplitude representative signal onto an RF carrier to form a modulated signal;
   first antenna means;
   a fourth path for the flow of signal between said antenna means and said first modulating means, for coupling said modulated signal to said antenna means for radiating said modulated signal toward a ground station;
   first receiving means located at said ground station for receiving said modulated signal, and for demodulating said modulated signal for recovering said amplitude-representative signal to form a recovered signal;
   logic means located at said ground station and coupled to said receiving means for sampling said recovered signal, and for, in response, generating recurrent command signals;
   second modulating means for modulating said command signals onto an RF carrier signal to form modulated command signals;
   transmitting means coupled to said second modulating means for transmitting said modulated command signals toward said satellite;
   second receiving means associated with said satellite and coupled to said phase shifting means, for receiving said modulated command signals, for demodulating said modulated command signals to form recovered command signals, and for applying said recovered command signals to said phase shifting means to thereby form a feedback loop for control of the relative phase of said RF signals in said second and third paths for the flow of RF signal in a manner tending to maintain said difference RF signal near a null and said sum RF signal near a maximum.

9. An arrangement according to claim 8, further comprising:
   transmit-receive multiplexing means including at least a first input port, a first output port, and an input-output port, said first input port of said multiplexing means being coupled to said sum output port of said hybrid power combiner for receiving said sum RF signal and for coupling said sum RF signal to said input-output port, said input-output port being coupled to said first antenna means for receiving said modulated command signals and for coupling said sum RF signal to said first antenna means for radiating said sum RF signal toward said Earth station, and said first output port being coupled to said second receiving means for coupling said modulated command signals thereto; and directional coupling means coupled to said first modulating means and said first path for the flow of RF signal, for coupling said modulated signal to said input port of said signal splitting means, whereby said modulated signal is coupled through said signal splitting means and said second and third paths for the flow of RF signal, to said sum output port of said hybrid signal combining means and to said first antenna means for transmission toward said ground station.

10. An arrangement according to claim 9, wherein said transmit-receive multiplexing means comprises a circulator.

11. An arrangement according to claim 4, wherein said source of RF signal to be transmitted further comprises communication signal processing means coupled to said data output port of said further multiplexing means for processing said data signals to produce processed data signals; and frequency conversion means coupled to said communication signal processing means for generating said RF signal to be transmitted.

* * * * *